(12) United States Patent
Song et al.

(10) Patent No.: US 11,775,119 B1
(45) Date of Patent: *Oct. 3, 2023

(54) CAPACITIVE TOUCH SENSING USING SYSTEM-IN-PACKAGE COMPONENTS

(71) Applicant: Amazon Technologies, Inc., Seattle, WA (US)

(72) Inventors: Fubin Song, Hong Kong (CN); Chaoran Yang, Shenzhen (CN); Shoubao Wang, Shenzhen (CN); Lixin Wu, Suzhou (CN); Cheng Xue, Shenzhen (CN)

(73) Assignee: Amazon Technologies, Inc., Seattle, WA (US)

( * ) Notice: Subject to any disclaimer, the term of this patent is extended or adjusted under 35 U.S.C. 154(b) by 184 days.

This patent is subject to a terminal disclaimer.

(21) Appl. No.: 17/224,756

(22) Filed: Apr. 7, 2021

(51) Int. Cl.
*G06F 3/044* (2006.01)
*H05K 1/02* (2006.01)
*G06F 1/18* (2006.01)
*H05K 9/00* (2006.01)

(52) U.S. Cl.
CPC .............. *G06F 3/044* (2013.01); *G06F 1/182* (2013.01); *H05K 1/023* (2013.01); *H05K 9/0064* (2013.01); *G06F 2203/04107* (2013.01); *H05K 9/0071* (2013.01); *H05K 2201/0707* (2013.01); *H05K 2201/10151* (2013.01)

(58) Field of Classification Search
CPC ..................... G06F 3/044; G06F 1/182; G06F 2203/04107; H05K 2201/0707; H05K 2201/10151; H05K 1/023; H05K 9/0071; H05K 9/0064
See application file for complete search history.

(56) References Cited

U.S. PATENT DOCUMENTS

| 10,158,384 | B1* | 12/2018 | Yarga | H04B 1/0458 |
| 10,541,200 | B2* | 1/2020 | Ooi | H01L 23/367 |
| 2009/0135579 | A1* | 5/2009 | Kim | G06F 3/0418 |
| | | | | 361/818 |
| 2012/0329524 | A1* | 12/2012 | Kent | G06F 3/0443 |
| | | | | 455/566 |
| 2013/0153273 | A1* | 6/2013 | Ko | H05K 1/0215 |
| | | | | 174/257 |
| 2017/0069954 | A1* | 3/2017 | Lui | H01Q 1/242 |

(Continued)

*Primary Examiner* — Darlene M Ritchie
(74) *Attorney, Agent, or Firm* — Eversheds Sutherland (US) LLP

(57) ABSTRACT

Systems, methods, and computer-readable media are disclosed for capacitive touch sensing using system-in-package components. In one embodiment, a device may include a flexible printed circuit, and a first system-in-package disposed on a first side of the flexible printed circuit. The first system-in-package may include a first molding compound, and a first electromagnetic interference shield disposed around an outer surface of the first molding compound. The device may include a first capacitive touch sensor, and a first stiffener disposed on a second side of the flexible printed circuit, where the first stiffener can be formed of a conductive material, and can be electrically coupled to both the flexible printed circuit and the first capacitive touch sensor. The first capacitive touch sensor may be configured to detect a change in capacitance via a change in electric field at the first electromagnetic interference shield.

20 Claims, 8 Drawing Sheets

(56) References Cited

U.S. PATENT DOCUMENTS

| | | | | |
|---|---|---|---|---|
| 2017/0290154 A1* | 10/2017 | Yong | ................... | H05K 9/0024 |
| 2018/0307342 A1* | 10/2018 | Roham | ................ | H03K 17/962 |
| 2019/0006294 A1* | 1/2019 | Ong | ....................... | H01L 24/17 |
| 2019/0051615 A1* | 2/2019 | Nair | ................... | H01L 21/4857 |
| 2021/0265732 A1* | 8/2021 | Eid | ...................... | H01L 23/552 |

\* cited by examiner

CAPACITIVE TOUCH SENSING USING SYSTEM-IN-PACKAGE COMPONENTS

BACKGROUND

Electronic devices may include various sensors. Some sensors, such as capacitive touch sensors, may have multiple components that consume physical space within devices. For example, a capacitive touch sensor may be positioned on a circuit board of a device and may therefore cause a footprint of the device to expand. However, devices with compact footprints or reduced thickness may be desired. Accordingly, capacitive touch sensing using system-in-package components may be desired.

Figure 1:
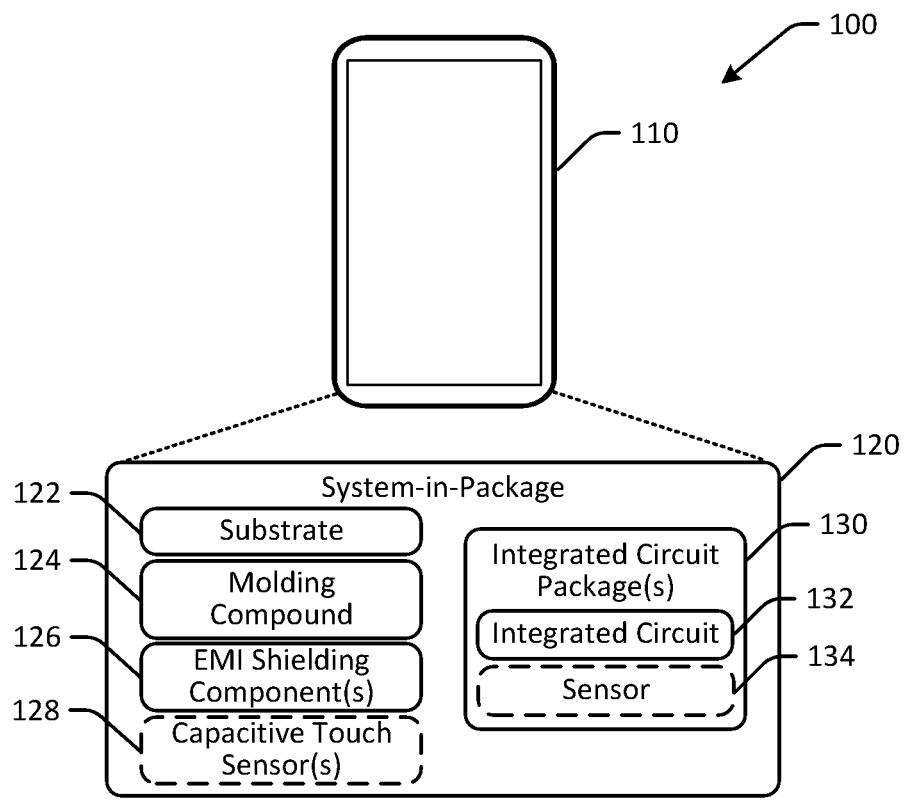
FIG. 1 is a schematic illustration of an example use case of system-in-package components used for capacitive touch sensing in accordance with one or more embodiments of the disclosure.
Figure 1:
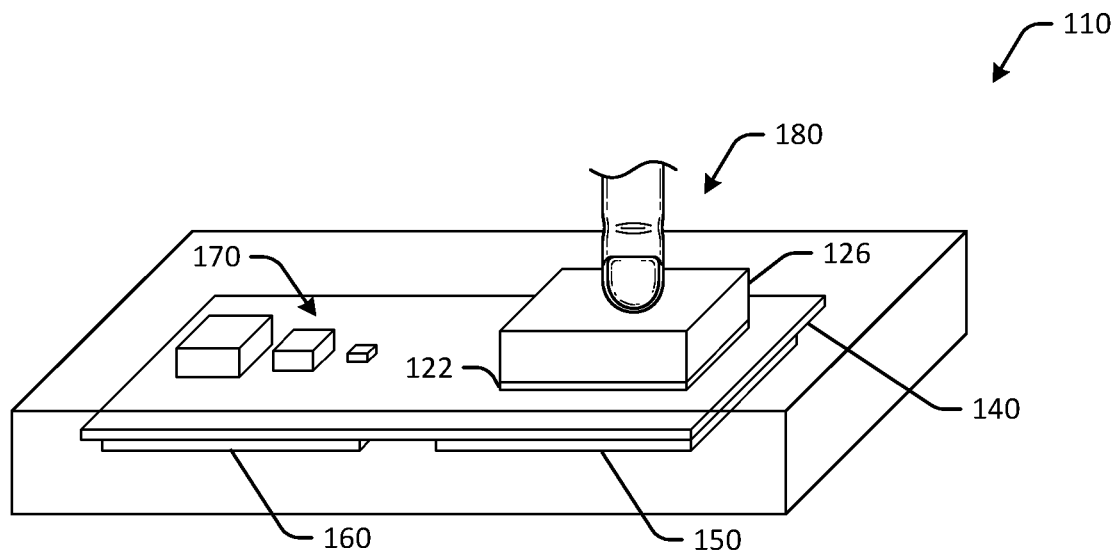

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Electronic devices may be used to consume content. Some electronic devices may use touch sensors, such as capacitive touch sensors, to detect user inputs. For example, a device may include a touchscreen display that users can use to interact with the device. Capacitive touch sensors may include a number of components that consume physical space within a device, which may impact not only height and width dimensions of the device, but a thickness of the device as well. Some of the components used in capacitive touch sensors may be used in other components as well, such as certain systems-in-packages, which may result in redundant components, each of which consumes space within the device.

A system-in-package may be a number of integrated circuits and/or other components that are enclosed in one or more chip carrier packages. Some systems-in-packages may include sensors. Systems-in-packages may provide flexibility in electronic device layout, such as by allowing for systems-in-packages to reduce device footprint. In addition, systems-in-packages may be complete functional units that can reduce device complexity.

Embodiments of the disclosure include systems-in-packages that can be used in conjunction with capacitive touch sensors to avoid redundant components, thereby reducing device footprint, decreasing manufacturing complexity, and reducing device costs. For example, some embodiments include systems-in-packages with an embedded capacitive touch sensor, where an electromagnetic interference shield disposed around an exterior of the system-in-package is used to detect input at the device via the capacitive touch sensor. As a result, certain standalone components of capacitive touch sensors may not be needed. Other embodiments include different structural designs and components, as discussed herein. Some embodiments use stiffener components, such as metal stiffener components, coupled to flexible printed circuits as components for capacitive touch sensing.

In some embodiments, touch sensing functionality for devices can be provided by utilizing an electromagnetic interference coating or shield (e.g., a metal layer, such as a stainless steel layer, a copper layer, etc.) of a system-in-package as part of a capacitive layer of a capacitive touch sensor. Some embodiments may utilize metal stiffeners that support portions of a flexible printed circuit to provide capacitive touch sensing functionality Other embodiments may use both the electromagnetic interference shields and the metal stiffeners together to provide capacitive touch sensing. Capacitive touch sensing can also be achieved via coupling between the electromagnetic interference shields of different systems-in-packages, and/or coupling between different metal stiffeners for flexible printed circuits. In some instances, different capacitance modes for capacitive touch sensing can be formed by using electromagnetic interference shielding and/or metal stiffeners. Metal stiffeners can be coupled to flexible printed circuits by soldering, electrical conductive glue, etc., and then connected to the capacitive touch sensor via one or more flexible printed circuit traces. Some embodiments may provide capacitive touch sensing functionality between system-in-package electromagnetic interference shielding and a metal shielding on rigid flex printed circuit boards. As a result, certain embodiments may provide capacitive touch sensing functionality with reduced device footprint, reduced manufacturing complexity, and decreased cost.

Embodiments of the disclosure include capacitive touch sensing using system-in-package components. Unlike typical systems-in-packages and capacitive touch sensors, certain embodiments may use components of systems-in-packages instead of dedicated capacitive touch sensor components, such as using an electromagnetic interference shield of a system-in-package as part of a capacitive layer of a capacitive touch sensor. In addition, some embodiments provide passive heat dissipation or active heat dissipation that remove heat generated by sensors and/or integrated circuits from the systems-in-packages, thereby increasing the number and/or types of integrated circuits or sensors that can be used with embodiments of the disclosure. Embodiments of the disclosure may be used in any suitable electronic device, such as smartphones or other mobile devices, wearables, Internet of Things devices, and the like.

This disclosure relates to, among other things, systems, methods, computer-readable media, techniques, and methodologies for capacitive touch sensing using system-in-package components. Embodiments may include systems-in-packages and capacitive touch sensors that share components, so as to provide a reduced footprint and improved device durability. Some embodiments may improve performance and increase functionality of systems-in-packages, while potentially reducing propensity for damage.

Referring to FIG. 1, an example use case 100 of a device 110 with system-in-package components used for capacitive touch sensing is depicted in accordance with one or more embodiments of the disclosure. The device 110 may be any suitable electronic device, such as a smartphone, an e-reader, a tablet, an audio or video streaming device, an Internet of Things device, a product ordering button or device, a home sensor, an aging in place device, an earphone, a speaker device, or another device. In the example of FIG. 1, the device 110 may be a smartphone with a capacitive touch display.

The device 110 may include one or more systems-in-packages 120. The system-in-package 120 may include a number of components, such as chips, including processors and/or memory, passive components, including resistors and/or capacitors, and/or other components that may be mounted on a substrate 122. In the example of FIG. 1, the substrate 122 may be a circuit board or other substrate. The system-in-package 120 may include additional components, such as a molding compound 124 that at least partially surrounds the components disposed on the substrate 122, one or more optional passive components, such as resistors and/or capacitors, one or more electromagnetic interference shielding components 126, and one or more optional capacitive touch sensors 128. In some embodiments, a capacitive touch sensor 128 may be part of the system-in-package 120, whereas in other embodiments, the capacitive touch sensor 128 may be positioned external to the system-in-package 120. The system-in-package 120 may include one or more integrated circuit packages 130.

Integrated circuit packages 130 may include one or more components, such as an integrated circuit 132 (which may include a number of semiconductors), and a sensor 134. The sensor 134 may be any suitable sensor, including, but not limited to, a microphone, a temperature sensor, humidity sensors, a pressure sensor, a camera, an optical sensor, a gas sensor, and/or other sensors or other component, such as a vibration motor.

The integrated circuit package 130 may be disposed on the substrate 122. The integrated circuit package 130 may have an upper surface and a lower surface, where the lower surface is coupled to the substrate 122. The integrated circuit package 130 may include the sensor 134, which may be one or more of a temperature sensor, a humidity sensor, a pressure sensor, an ambient light sensor, a microphone, a gas sensor, or a different type of sensor.

The molding compound 124 may be disposed on the substrate 122. The molding compound 124 may be any suitable molding compound and may be formed of a material such as a thermosetting material, thermoplastic material, or polymer-based material. Other materials may be used. The molding compound 124 may at least partially surround or otherwise encompass components disposed on the substrate 122. For example, the capacitive touch sensor 128 may be embedded in the molding compound 124, and the integrated circuit package 130 may be partially or fully embedded in the molding compound 124. In other embodiments, an optional semiconductor chip may be embedded in the molding compound 124. The electromagnetic interference shielding component 126 may be disposed around the molding compound 124. For example, the electromagnetic interference shielding component 126 may encompass or encapsulate at least some of the molding compound 124.

The device 110 is illustrated in a schematic perspective view in FIG. 1. The device 110 may include a flexible printed circuit 140. The system-in-package 120 may be coupled to a first side of the flexible printed circuit 140. The device 110 may include a number of additional components 170, such as prepackaged integrated circuits, passive components, etc. that are coupled to the first side of the flexible printed circuit 140. The device 110 may include a first metal stiffener 150 coupled to a second side of the flexible printed circuit 140, and a second metal stiffener 160 coupled to the second side of the flexible printed circuit 140. The first metal stiffener 150 and the second metal stiffener 160 may be metal components configured to provide rigidity to portions of the flexible printed circuit 140. In the depicted example, the first side of the flexible printed circuit 140 may be a top side, and the second side of the flexible printed circuit 140 may be a bottom side. The first metal stiffener 150 and the second metal stiffener 160 may be coupled to the flexible printed circuit 140 using a pressure sensitive adhesive or other coupling layer.

The capacitive touch sensor 128 may be disposed inside the system-in-package 120, or disposed external to the system-in-package 120, such as adjacent to the additional components 170. The capacitive touch sensor 128 may be configured to detect the presence of a conductive element, such as a user's finger 180, at or near the electromagnetic interference shielding component 126 of the system-in-package. Capacitive sensors use the characteristics of a capacitor and its electrical field to form a sensor. Capacitive sensors work by detecting a change in the electric field registered by a sensor to determine either touch or proximity. For example, when the user touches the screen, he or she changes the capacitance, which is detected as a change and interpreted as a touch event.

In the embodiment illustrated in FIG. 1, a change in electric field caused by the user's finger 180 may be detected at the electromagnetic interference shielding component 126. An indication of the change may be sent to the capacitive touch sensor 128 via electrical contact or electrical coupling between the electromagnetic interference shielding component 126, the first metal stiffener 150, the flexible printed circuit 140, and the capacitive touch sensor 128. For example, a change in electric field determined at the electromagnetic interference shielding component 126 may be detected by the capacitive touch sensor 128 by way of the first metal stiffener 150 and the flexible printed circuit 140.

Figure 2:
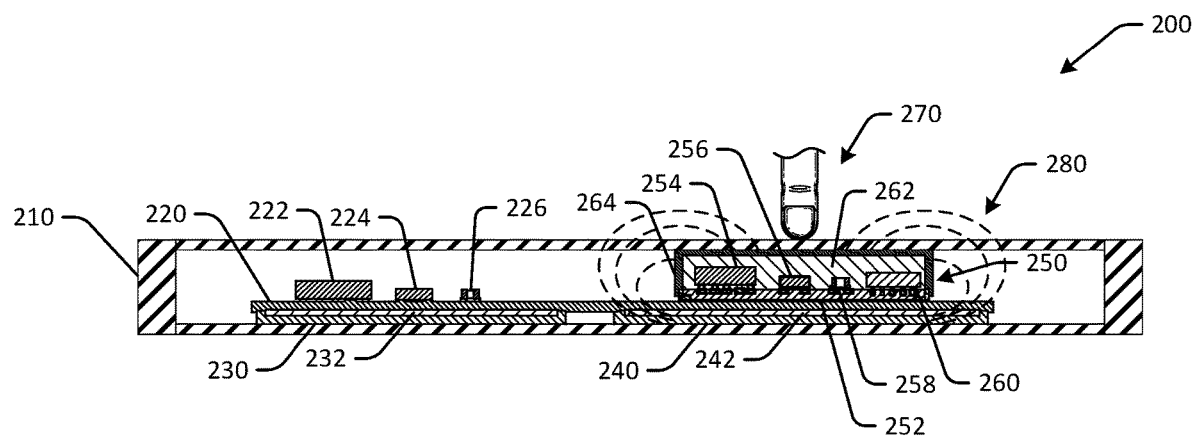
FIG. 2 is a schematic illustration of an example system-in-package on a flexible printed circuit used for capacitive touch sensing in accordance with one or more embodiments of the disclosure.

Referring to FIG. 2, a schematic drawing of an example system-in-package on a flexible printed circuit used for capacitive touch sensing is depicted in accordance with one or more embodiments of the disclosure. Other embodiments may include additional or fewer components.

In FIG. 2, a device 200 is depicted in cross-sectional view. The device 200 may include a housing 210, which may be formed of any suitable material, such as glass, plastic, rubber, composite, or a different type of material. The device 200 may include a flexible printed circuit 220. The flexible printed circuit 220 may be arranged in a planar, flat, or unfolded configuration. The flexible printed circuit 220 may include a number of conductive traces bonded on a flexible substrate. A number of components may be disposed on the flexible printed circuit 220.

For example, a prepackaged integrated circuit 222 may be disposed on a first side of the flexible printed circuit 220. A capacitive touch sensor 224 may be disposed adjacent to the prepackaged integrated circuit 222 on the flexible printed circuit 220. In some instances, the capacitive touch sensor 224 may be disposed inside a system-in-package instead of being disposed on the flexible printed circuit 220 as depicted. One or more passive components 226, such as resistors, may be disposed adjacent to the capacitive touch sensor 224.

A first system-in-package 250 may be disposed on the first side of the flexible printed circuit 220. The first system-in-package 250 may be electrically coupled to the flexible printed circuit 220. The first system-in-package 250 may include a number of components. For example, the first system-in-package 250 may include a substrate 252. The first system-in-package 250 may include a first integrated circuit package 254, a capacitive touch sensor 256, one or more passive components 258, and one or more optional flip chip integrated circuits 260 positioned on the substrate 252. A flip chip integrated circuit 260 may be used to facilitate connections to other components of a device, such as other semiconductor components. The first system-in-package 250 may include a first molding compound 262 disposed over the first integrated circuit package 254, the first capacitive touch sensor 256, and/or the other components disposed on the substrate 252, such as the one or more passive components 258 and the one or more optional flip chip integrated circuits 260. Accordingly, the components on the substrate 252 may be embedded in the first molding compound 262. The first molding compound 262 may be formed of a material such as a thermosetting material, thermoplastic material, or polymer-based material. The first molding compound 262 may encompass or encapsulate the components of the first system-in-package 250 that are disposed on the substrate 252.

The first system-in-package 250 may include a first electromagnetic interference shield 264 disposed around an outer surface of the first molding compound 262. The first electromagnetic interference shield 264 may be a fence, coating, or other component formed of a metal material and configured to prevent electromagnetic interference. In some embodiments, the first electromagnetic interference shield 264 may be formed of more than one component, while in other embodiments, the first electromagnetic interference shield 264 may be a contiguous shield or single piece assembly.

The first system-in-package 250 of FIG. 2 may be similar to the system-in-package 120 of FIG. 1, but depicts a capacitive touch sensor in two different locations. In some embodiments, only one of the two depicted capacitive touch sensors 224, 256 may be included. In other embodiments, both depicted capacitive touch sensors 224, 256 may be included. For example, in some embodiments, the capacitive touch sensor 224 may be included in the device 200, and the capacitive touch sensor 256 may not be included, or the capacitive touch sensor 256 may be included as part of the system-in-package 250, and the capacitive touch sensor 224 may not be included. Positioning of the capacitive touch sensor inside the system-in-package 250 may provide a smaller overall footprint for the assembly, whereas positioning of the capacitive touch sensor outside the system-in-package (or external to the system-in-package) may provide improved system performance due to reduced signal delay (e.g., the signal does not have to travel through the system-in-package components to reach the capacitive touch sensor, etc.).

The device 200 may include a first metal stiffener 240 disposed on a second side of the flexible printed circuit 220 (e.g., where the second side may be the opposite side of the flexible printed circuit 220 relative to the first side, etc.). The first metal stiffener 240 may be electrically coupled to both the flexible printed circuit 220 and the first capacitive touch sensor 256 (and/or capacitive touch sensor 224). For example, the first metal stiffener 240 may be electrically coupled to the flexible printed circuit 220 using soldering, electrical conductive glue, or another suitable method. The first metal stiffener 240 may be coupled to the flexible printed circuit 220 with a first pressure sensitive adhesive layer 242. For example, the first pressure sensitive adhesive layer 242 may be disposed between the flexible printed circuit 220 and the first metal stiffener 240.

The device 200 may include a second metal stiffener 230 disposed on the second side of the flexible printed circuit 220 (e.g., where the second side may be the opposite side of the flexible printed circuit 220 relative to the first side, etc.). The second metal stiffener 230 may be electrically coupled to both the flexible printed circuit 220 and the first capacitive touch sensor 256 (and/or capacitive touch sensor 224). For example, the second metal stiffener 230 may be electrically coupled to the flexible printed circuit 220 using soldering, electrical conductive glue, or another suitable method. The second metal stiffener 230 may be coupled to the flexible printed circuit 220 with a second pressure sensitive adhesive layer 232. For example, the second pressure sensitive adhesive layer 232 may be disposed between the flexible printed circuit 220 and the second metal stiffener 230.

The first capacitive touch sensor 256 and/or the capacitive touch sensor 224 may be configured to detect a change in capacitance via a change in electric field 280 at the first electromagnetic interference shield 264 of the first system-in-package 250. For example, as a conductive element 270 comes within proximity to the device 200 or makes contact with the device 200, the first capacitive touch sensor 256 and/or the capacitive touch sensor 224 may detect the event as a touch input based at least in part on a change in capacitance. The change in capacitance may be detected based on a change in the electric field 280 at the first electromagnetic interference shield 264 of the first system-in-package 250.

The device 200 may therefore include the flexible printed circuit 220, and a first system-in-package 250 disposed on a first side of the flexible printed circuit 220. The first system-in-package 250 may include the first molding compound 262 and the first electromagnetic interference shield 264, such as an electromagnetic interference fence, an electromagnetic interference shield, an electromagnetic interference coating, or other form of electromagnetic interference component, that is disposed around an outer surface of the first molding compound 262. The device 200 may include the first capacitive touch sensor (e.g., one or both of capacitive touch sensors 224, 256, etc.) and the first stiffener, such as the first metal stiffener 240, that is disposed on the second side of the flexible printed circuit 220. The first stiffener may be formed of a conductive material, such as metal, and may be electrically coupled to both the flexible printed circuit 220 and the first capacitive touch sensor 224, 256.

Example embodiments of the disclosure provide a number of technical features or technical effects. For example, in accordance with example embodiments of the disclosure, certain embodiments of the disclosure may include systems-in-packages with improved heat dissipation, thereby facilitating increase component density and improved performance Some embodiments may include integrated capacitive touch sensors and systems-in-packages. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 3:
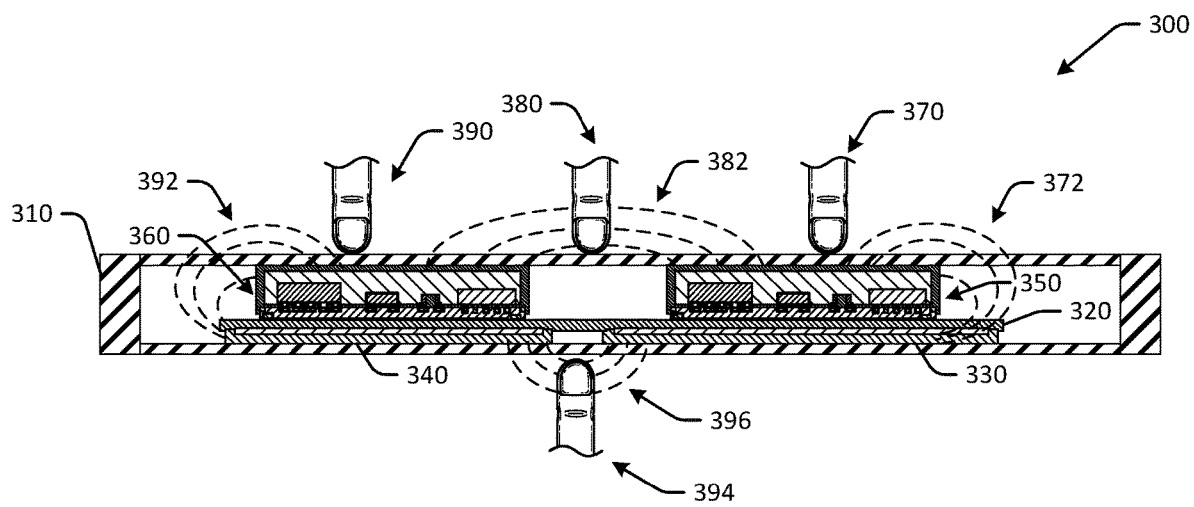
FIG. 3 is a schematic illustration of example systems-in-packages used for capacitive touch sensing in a horizontal arrangement in accordance with one or more embodiments of the disclosure.

Referring to FIG. 3, a schematic drawing of example systems-in-packages used for capacitive touch sensing in a horizontal arrangement in a device 300 in accordance with one or more embodiments of the disclosure. Other embodiments may include additional or fewer components.

The systems-in-packages of FIG. 3 may be similar to the system-in-package 200 of FIG. 2, but may include two discrete systems-in-packages, along with two discrete metal stiffeners. The systems-in-packages 300 may therefore provide capacitive touch functionality not only adjacent to each of the individual systems-in-packages, but also between the two systems-in-packages at an upper side of the device, as well as between the two metal stiffeners at a lower side of the device. Unlike the embodiment of FIG. 2, the individual systems-in-packages may include capacitive touch sensors disposed inside the respective systems-in-packages.

The systems-in-packages are illustrated in the device 300 in a side cross-sectional view in FIG. 3. The device 300 may include a housing 310, which may be formed of any suitable material, such as glass, plastic, rubber, composite, or a different type of material. The device 300 may include a flexible printed circuit 320. The flexible printed circuit 320 may be arranged in a planar, flat, or unfolded configuration. The flexible printed circuit 320 may include a number of conductive traces bonded on a flexible substrate. A number of components may be disposed on the flexible printed circuit 320.

For example, a first system-in-package 350 may be disposed on the flexible printed circuit 320. A second system-in-package 360 may be disposed on the flexible printed circuit 320 adjacent to the first system-in-package 350. The first system-in-package 350 may be separated from the second system-in-package 360 by a distance, such as five millimeters.

The first system-in-package 350 may be disposed on the first side of the flexible printed circuit 320. The first system-in-package 350 may be electrically coupled to the flexible printed circuit 320. The first system-in-package 350 may include a number of components. For example, the first system-in-package 350 may include a substrate. The first system-in-package 350 may include a first integrated circuit package, a capacitive touch sensor, one or more passive components, and one or more optional flip chip integrated circuits positioned on the substrate. A flip chip integrated circuit may be used to facilitate connections to other components of a device, such as other semiconductor components. The first system-in-package 350 may include a first molding compound disposed over the first integrated circuit package, the first capacitive touch sensor, and/or the other components disposed on the substrate, such as the one or more passive components and the one or more optional flip chip integrated circuits. Accordingly, the components on the substrate may be embedded in the first molding compound. The first molding compound may be formed of a material such as a thermosetting material, thermoplastic material, or polymer-based material. The first molding compound may encompass or encapsulate the components of the first system-in-package 350 that are disposed on the substrate.

The first system-in-package 350 may include a first electromagnetic interference shield disposed around an outer surface of the first molding compound. The first electromagnetic interference shield may be a fence, coating, or other component formed of a metal material and configured to prevent electromagnetic interference. In some embodiments, the first electromagnetic interference shield may be formed of more than one component, while in other embodiments, the first electromagnetic interference shield may be a contiguous shield or single piece assembly.

The second system-in-package 360 may be disposed on the first side of the flexible printed circuit 320. The second system-in-package 360 may be electrically coupled to the flexible printed circuit 320. The second system-in-package 360 may include a number of components. For example, the second system-in-package 360 may include a substrate. The second system-in-package 360 may include a second integrated circuit package, a capacitive touch sensor, one or more passive components, and one or more optional flip chip integrated circuits positioned on the substrate. A flip chip integrated circuit may be used to facilitate connections to other components of a device, such as other semiconductor components. The second system-in-package 360 may include a second molding compound disposed over the second integrated circuit package, the second capacitive touch sensor, and/or the other components disposed on the substrate, such as the one or more passive components and the one or more optional flip chip integrated circuits. Accordingly, the components on the substrate may be embedded in the second molding compound. The second molding compound may be formed of a material such as a thermosetting material, thermoplastic material, or polymer-based material. The second molding compound may encompass or encapsulate the components of the second system-in-package 360 that are disposed on the substrate.

The second system-in-package 360 may include a second electromagnetic interference shield disposed around an outer surface of the second molding compound. The second electromagnetic interference shield may be a fence, coating, or other component formed of a metal material and configured to prevent electromagnetic interference. In some embodiments, the second electromagnetic interference shield may be formed of more than one component, while in other embodiments, the second electromagnetic interference shield may be a contiguous shield or single piece assembly.

The device 300 may include a first metal stiffener 330 disposed on a second side of the flexible printed circuit 320

(e.g., where the second side may be the opposite side of the flexible printed circuit 320 relative to the first side, etc.). The first metal stiffener 330 may be electrically coupled to both the flexible printed circuit 320 and the first capacitive touch sensor of the first system-in-package 350. For example, the first metal stiffener 330 may be electrically coupled to the flexible printed circuit 320 using soldering, electrical conductive glue, or another suitable method. The first metal stiffener 330 may be coupled to the flexible printed circuit 320 with a first pressure sensitive adhesive layer. For example, the first pressure sensitive adhesive layer may be disposed between the flexible printed circuit 320 and the first metal stiffener 330.

The device 300 may include a second metal stiffener 340 disposed on the second side of the flexible printed circuit 320 (e.g., where the second side may be the opposite side of the flexible printed circuit 320 relative to the first side, etc.) adjacent to the first metal stiffener 330. The second metal stiffener 340 may be electrically coupled to both the flexible printed circuit 320 and the second capacitive touch sensor of the second system-in-package 360. For example, the second metal stiffener 340 may be electrically coupled to the flexible printed circuit 320 using soldering, electrical conductive glue, or another suitable method. The second metal stiffener 340 may be coupled to the flexible printed circuit 320 with a second pressure sensitive adhesive layer. For example, the second pressure sensitive adhesive layer may be disposed between the flexible printed circuit 320 and the second metal stiffener 340.

The first capacitive touch sensor of the first system-in-package 350 and/or the second capacitive touch sensor of the second system-in-package 360 may be configured to detect a change in capacitance via a change in electric field 372 at the first electromagnetic interference shield of the first system-in-package 350. For example, as a conductive element 370 comes within proximity to the device 300 or makes contact with the device 300, the first capacitive touch sensor of the first system-in-package 350 may detect the event as a touch input based at least in part on a change in capacitance. The change in capacitance may be detected based on a change in the electric field 372 at the first electromagnetic interference shield of the first system-in-package 350.

The first capacitive touch sensor of the first system-in-package 350 and/or the second capacitive touch sensor of the second system-in-package 360 may be configured to detect a change in capacitance via a change in electric field 382 at a location between the first electromagnetic interference shield of the first system-in-package 350 and the second electromagnetic interference shield of the second system-in-package 360. For example, as a conductive element 380 comes within proximity to the device 300 or makes contact with the device 300, the first capacitive touch sensor of the first system-in-package 350 and/or the second electromagnetic interference shield of the second system-in-package 360 may detect the event as a touch input based at least in part on a change in capacitance. The change in capacitance may be detected based on a change in the electric field 382 at the first electromagnetic interference shield of the first system-in-package 350 and/or the second electromagnetic interference shield of the second system-in-package 360.

The second capacitive touch sensor of the second system-in-package 360 and/or the first capacitive touch sensor of the first system-in-package 350 may be configured to detect a change in capacitance via a change in electric field 392 at the second electromagnetic interference shield of the second system-in-package 360. For example, as a conductive element 390 comes within proximity to the device 300 or makes contact with the device 300, the second capacitive touch sensor of the second system-in-package 360 may detect the event as a touch input based at least in part on a change in capacitance. The change in capacitance may be detected based on a change in the electric field 392 at the second electromagnetic interference shield of the second system-in-package 360.

The first capacitive touch sensor of the first system-in-package 350 and/or the second capacitive touch sensor of the second system-in-package 360 may be configured to detect a change in capacitance via a change in electric field 396 at a location between the first metal stiffener 330 and the second metal stiffener 340. For example, as a conductive element 394 comes within proximity to the device 300 or makes contact with the device 300, the first capacitive touch sensor of the first system-in-package 350 and/or the second electromagnetic interference shield of the second system-in-package 360 may detect the event as a touch input based at least in part on a change in capacitance. The change in capacitance may be detected based on a change in the electric field 396 at the first metal stiffener 330 and/or the second metal stiffener 340.

Accordingly, the embodiment of the device 300 depicted in the example of FIG. 3 may provide additional touch sensing functionality than otherwise available with two systems-in-packages. In some embodiments, the first capacitive touch sensor of the first system-in-package 350 and/or the second capacitive touch sensor of the second system-in-package 360 may both be configured to detect a change in capacitance via a respective change in electric field at the first electromagnetic interference shield of the first system-in-package 350 and/or the second electromagnetic interference shield of the second system-in-package 360. In some embodiments, the first capacitive touch sensor of the first system-in-package 350 and/or the second capacitive touch sensor of the second system-in-package 360 may both be configured to detect a change in capacitance via a respective change in electric field at the first stiffener 330 and/or the second stiffener 340.

The device 300 may include the first system-in-package 350 disposed on a first side of the flexible printed circuit 320, and the second system-in-package 360 disposed on the first side of the flexible printed circuit 320, where the first system-in-package 350 and the second system-in-package 360 are electrically coupled to the flexible printed circuit 320. The first system-in-package 350 and the second system-in-package 360 may each include an integrated circuit package, a capacitive touch sensor, a molding compound disposed over the integrated circuit packages and the capacitive touch sensors, and a electromagnetic interference shield disposed around an outer surface of the molding compound. The device 300 may include the first metal stiffener 330 and the second metal stiffener 340, both of which may be disposed on the second side of the flexible printed circuit 320.

The first capacitive touch sensor and/or the second capacitive touch sensor may be configured to detect a change in capacitance via a respective change in electric field at the first electromagnetic interference shield and the second electromagnetic interference shield responsive to one or more changes in electrical field. For example, presence of a conductive element external to the device 300 at a first point between the first system-in-package 350 and the second system-in-package 360 on the first side of the flexible printed circuit 320 may be detected. In another example, presence of the conductive element external to the device 300 at a second point between the first system-in-package 350 and the second system-in-package 360 on the second side of the flexible printed circuit 320 may be detected. In some embodiments, presence of the conductive element external to the device 300 at a point between the first metal stiffener 330 and the second metal stiffener 340 on the second side of the flexible printed circuit 320 may be detected.

Figure 4:
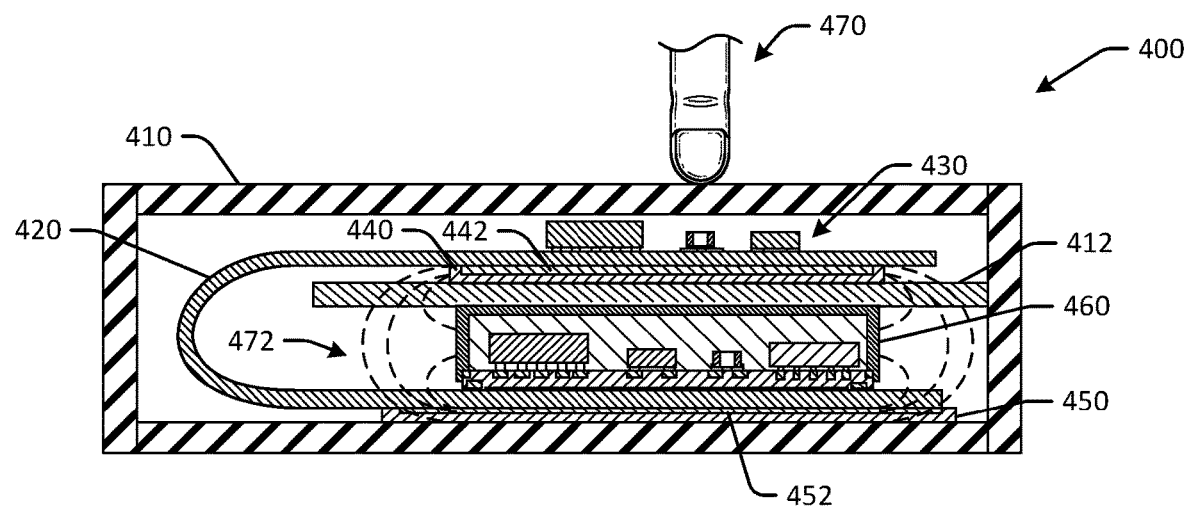
FIG. 4 is a schematic illustration of example systems-in-packages used for capacitive touch sensing in a vertical arrangement in accordance with one or more embodiments of the disclosure.
Figure 4:
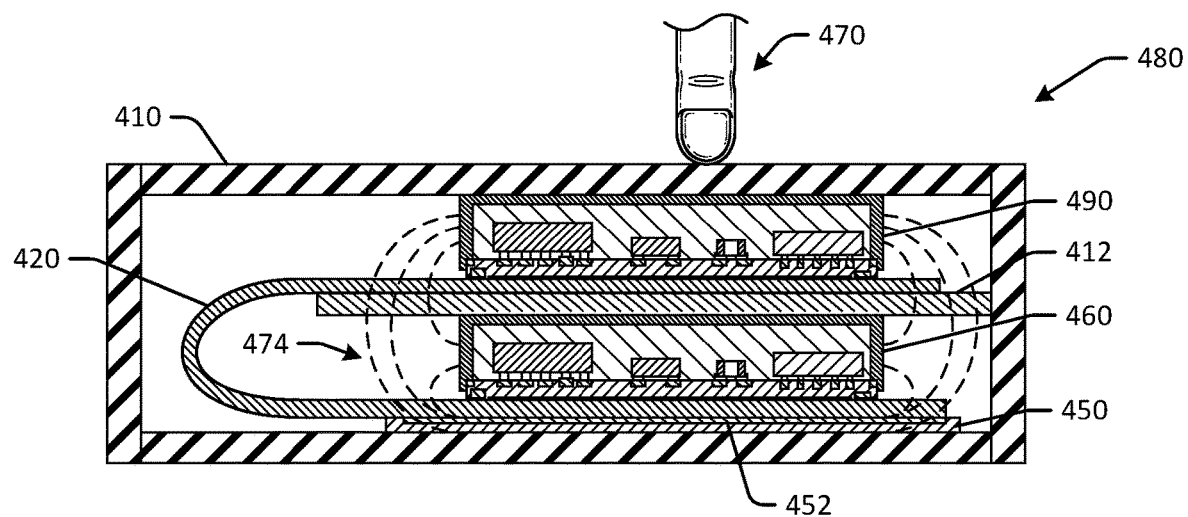

FIG. 4 is a schematic illustration of example systems-in-packages used for capacitive touch sensing in a vertical arrangement in a device in accordance with one or more embodiments of the disclosure. Other embodiments may include additional or fewer components.

The systems-in-packages of FIG. 4 may be similar to the system-in-package 200 of FIG. 2 and system-in-package of FIG. 3, but may include a flexible printed circuit that is in a folded or bent configuration instead of a planar configuration. The components disposed on the flexible printed circuit may therefore be vertically aligned, or otherwise form a stacked arrangement. The embodiments may nonetheless provide touch sensing functionality via use of the electromagnetic interference shields and/or stiffener components of the respective systems-in-packages.

A first device 400 having a first system-in-package 460 is illustrated in a side cross-sectional view in FIG. 4. The device 400 may include a housing 410, which may be formed of any suitable material, such as glass, plastic, rubber, composite, or a different type of material. The housing 410 may include a planar member 412 that may be coupled to the housing 410.

The device 400 may include a flexible printed circuit 420. The flexible printed circuit 420 may be arranged in a curved or folded configuration. For example, the planar member 412 may be configured to support a portion of the flexible printed circuit 420. The flexible printed circuit 420 may include a number of conductive traces bonded on a flexible substrate. A number of components may be disposed on the flexible printed circuit 420.

For example, the first system-in-package 460 may be disposed on the flexible printed circuit 420. The first system-in-package 460 may be disposed on a first side of the flexible printed circuit 420. The first system-in-package 460 may be electrically coupled to the flexible printed circuit 420. The first system-in-package 460 may include a number of components. For example, the first system-in-package 460 may include a substrate. The first system-in-package 460 may include a first integrated circuit package, a capacitive touch sensor, one or more passive components, and one or more optional flip chip integrated circuits positioned on the substrate. A flip chip integrated circuit may be used to facilitate connections to other components of a device, such as other semiconductor components. The first system-in-package 460 may include a first molding compound disposed over the first integrated circuit package, the first capacitive touch sensor, and/or the other components disposed on the substrate, such as the one or more passive components and the one or more optional flip chip integrated circuits. Accordingly, the components on the substrate may be embedded in the first molding compound. The first molding compound may be formed of a material such as a thermosetting material, thermoplastic material, or polymer-based material. The first molding compound may encompass or encapsulate the components of the first system-in-package 460 that are disposed on the substrate.

The first system-in-package 460 may include a first electromagnetic interference shield disposed around an outer surface of the first molding compound. The first electromagnetic interference shield may be a fence, coating, or other component formed of a metal material and configured to prevent electromagnetic interference. In some embodiments, the first electromagnetic interference shield may be formed of more than one component, while in other embodiments, the first electromagnetic interference shield may be a contiguous shield or single piece assembly.

The device 400 may include additional components 430 disposed on a second side of the flexible printed circuit 420 (e.g., where the second side may be the opposite side of the flexible printed circuit 420 relative to the first side, etc.). The additional components 430 may be one or more of passive components, capacitive touch sensors, integrated circuits, flip chips, and/or other components. The additional components 430 may include a passive component that is disposed on the second side of the flexible printed circuit 420, such that the passive component is at a top side of the device 400 when the flexible printed circuit is in the folded configuration ("top" and "bottom" are used to indicate relative positioning and not absolute positioning herein). The flexible printed circuit 420 may be folded about the planar member 412, such that the first system-in-package 460 is disposed on a first side of the planar member 412, and the additional components 430 are disposed on a second side of the planar member 412.

The device 400 may include a first metal stiffener 450 disposed on the second side of the flexible printed circuit 420 (e.g., where the second side may be the opposite side of the flexible printed circuit 420 relative to the first side, etc.). The first metal stiffener 450 may be electrically coupled to both the flexible printed circuit 420 and the first capacitive touch sensor of the first system-in-package 460. For example, the first metal stiffener 450 may be electrically coupled to the flexible printed circuit 420 using soldering, electrical conductive glue, or another suitable method. The first metal stiffener 450 may be coupled to the flexible printed circuit 420 with a first pressure sensitive adhesive layer 452. For example, the first pressure sensitive adhesive layer 452 may be disposed between the flexible printed circuit 420 and the first metal stiffener 450.

The device 400 may include a second metal stiffener 440 disposed on the first side of the flexible printed circuit 420 (e.g., the same side as the system-in-package 460, etc.). The second metal stiffener 440 may be electrically coupled to both the flexible printed circuit 420 and the first capacitive touch sensor of the first system-in-package 460. For example, the second metal stiffener 440 may be electrically coupled to the flexible printed circuit 420 using soldering, electrical conductive glue, or another suitable method. The second metal stiffener 440 may be coupled to the flexible printed circuit 420 with a second pressure sensitive adhesive layer 442. For example, the second pressure sensitive adhesive layer 442 may be disposed between the flexible printed circuit 420 and the second metal stiffener 440.

The first metal stiffener 450, the first system-in-package 460, and the second metal stiffener 440 may therefore be vertically aligned, or stacked, and the first capacitive touch sensor in the first system-in-package 460 may be configured to detect a change in capacitance via a change in electric field at the second metal stiffener 440.

The first capacitive touch sensor of the first system-in-package 460 may be configured to detect a change in capacitance via a change in electric field 472 at the second metal stiffener 440. For example, as a conductive element 470 comes within proximity to the device 400 or makes contact with the device 400, the first capacitive touch sensor of the first system-in-package 460 and/or a capacitive touch sensor of the additional components 430 may detect the event as a touch input based at least in part on a change in capacitance. The change in capacitance may be detected based on a change in the electric field 472 at the first metal stiffener 450 or the second metal stiffener 440.

In another embodiment, a second device 480 may include two systems-in-packages disposed in a vertically aligned, or stacked, arrangement. The second device 480 having the first system-in-package 460 and a second system-in-package 490 is illustrated in a side cross-sectional view in FIG. 4. The device 480 may include the housing 410 having the planar member 412, the flexible printed circuit 420 arranged in a curved or folded configuration, and the first metal stiffener 450. However, instead of the additional components 430, the device 480 may include the second system-in-package 490.

The first system-in-package 460 may be disposed on a first side of the flexible printed circuit 420, and the second system-in-package 490 may be disposed on a second side of the flexible printed circuit 420. The second system-in-package 490 may be at a top side of the device 480 when the flexible printed circuit is in the folded configuration ("top" and "bottom" are used to indicate relative positioning and not absolute positioning herein). The flexible printed circuit 420 may be folded about the planar member 412, such that the first system-in-package 460 is disposed on a first side of the planar member 412, and the second system-in-package 490 is disposed on a second side of the planar member 412. The second system-in-package 490 may be electrically coupled to the flexible printed circuit 420. The second system-in-package 490 may include a number of components, and may have the same configuration or a different configuration than the first system-in-package 460. The second system-in-package 490 may include a second electromagnetic interference shield disposed around an outer surface of the molding compound.

The second device 480 may include the first metal stiffener 450 disposed on the second side of the flexible printed circuit 420. The first metal stiffener 450 may be electrically coupled to both the flexible printed circuit 420 and the first capacitive touch sensor of the first system-in-package 460. For example, the first metal stiffener 450 may be electrically coupled to the flexible printed circuit 420 using soldering, electrical conductive glue, or another suitable method. The first metal stiffener 450 may be coupled to the flexible printed circuit 420 with the first pressure sensitive adhesive layer 452. For example, the first pressure sensitive adhesive layer 452 may be disposed between the flexible printed circuit 420 and the first metal stiffener 450. In some embodiments, the second device 480 may not include the second metal stiffener 440.

The first metal stiffener 450, the first system-in-package 460, and the second system-in-package 490 may therefore be vertically aligned, or stacked, and the first capacitive touch sensor in the first system-in-package 460 may be configured to detect a change in capacitance via a change in electric field 474 at the second system-in-package 490. For example, as the conductive element 470 comes within proximity to the device 480 or makes contact with the device 480, the first capacitive touch sensor of the first system-in-package 460 and/or a capacitive touch sensor of the second system-in-package 490 may detect the event as a touch input based at least in part on a change in capacitance.

In some embodiments, the capacitive touch sensor of the first system-in-package 460 and second capacitive touch sensor of the second system-in-package 490 are both configured to detect a change in capacitance via a respective change in electric field at the first electromagnetic interference shield responsive to presence of a conductive element external to the device adjacent to the second system-in-package 490.

Figure 5:
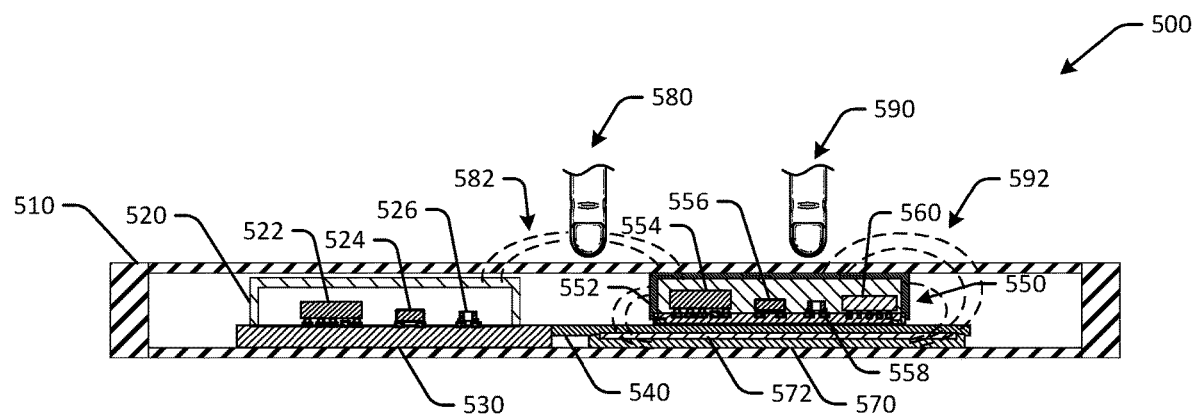
FIG. 5 is a schematic illustration of an example system-in-package on a rigid flex printed circuit board used for capacitive touch sensing in accordance with one or more embodiments of the disclosure.

FIG. 5 is a schematic illustration of an example system-in-package on a rigid flex printed circuit board used for capacitive touch sensing in a device 500 in accordance with one or more embodiments of the disclosure. Other embodiments may include additional or fewer components.

The embodiment of the device 500 of FIG. 5 may be similar to the embodiment of FIG. 3, but may include a rigid flex printed circuit board instead of a flexible printed circuit, and may include a metal shielding 520 disposed adjacent to a system-in-package 550. In particular, the system-in-package 550 may be disposed on a flexible portion 540 of the rigid flex printed circuit board, and the metal shielding 520 may be disposed on a rigid portion 530 of the rigid flex printed circuit board.

The device 500 is depicted in a side cross-sectional view in FIG. 5. The device 500 may include a housing 510, which may be formed of any suitable material, such as glass, plastic, rubber, composite, or a different type of material. The device 500 may include the rigid flex printed circuit board having the flexible portion 540 and the rigid portion 530. The rigid flex printed circuit board may be arranged in a planar, flat, or unfolded configuration. A number of components may be disposed on the rigid flex printed circuit board.

For example, a first system-in-package 550 may be disposed on the rigid flex printed circuit board. A metal shielding 520 may be disposed on the rigid flex printed circuit board adjacent to the first system-in-package 550. The first system-in-package 550 may be separated from the metal shielding 520 by a distance, such as five millimeters.

The first system-in-package 550 may be disposed on the first side of the rigid flex printed circuit board. The first system-in-package 550 may be electrically coupled to the rigid flex printed circuit board. The first system-in-package 550 may include a number of components. For example, the first system-in-package 550 may include a substrate. The first system-in-package 550 may include a first integrated circuit package 554, a capacitive touch sensor 556, one or more passive components 558, and one or more optional flip chip integrated circuits 560 positioned on the substrate. A flip chip integrated circuit may be used to facilitate connections to other components of a device, such as other semiconductor components. The first system-in-package 550 may include a first molding compound disposed over the first integrated circuit package 554, the first capacitive touch sensor 556, and/or the other components disposed on the substrate, such as the one or more passive components 558 and the one or more optional flip chip integrated circuits 560. Accordingly, the components on the substrate may be embedded in the first molding compound. The first molding compound may be formed of a material such as a thermosetting material, thermoplastic material, or polymer-based material. The first molding compound may encompass or encapsulate the components of the first system-in-package 550 that are disposed on the substrate.

The first system-in-package 550 may include a first electromagnetic interference shield 552 disposed around an outer surface of the first molding compound. The first electromagnetic interference shield 552 may be a fence, coating, or other component formed of a metal material and configured to prevent electromagnetic interference. In some embodiments, the first electromagnetic interference shield 552 may be formed of more than one component, while in other embodiments, the first electromagnetic interference shield 552 may be a contiguous shield or single piece assembly.

The device 500 may include a number of additional components, such as a second integrated circuit package 522, a second capacitive touch sensor 524, one or more second passive components 526, and/or other components disposed on the rigid portion 530 of the rigid flex printed circuit board. The additional components may be at least partially surrounded by the metal shielding 520. The metal shielding 520 may be a fence, coating, or other component formed of a metal material and configured to prevent electromagnetic interference. In some embodiments, the first electromagnetic interference shield may be formed of more than one component, while in other embodiments, the first electromagnetic interference shield may be a contiguous shield or single piece assembly.

The device 500 may include a first metal stiffener 570 disposed on a second side of the flexible portion 540 of the rigid flex printed circuit board. The first metal stiffener 570 may be electrically coupled to the first capacitive touch sensor 556 of the first system-in-package 550. For example, the first metal stiffener 570 may be electrically coupled to rigid flex printed circuit board using soldering, electrical conductive glue, or another suitable method. The first metal stiffener 570 may be coupled to the rigid flex printed circuit board with a first pressure sensitive adhesive layer 572. For example, the first pressure sensitive adhesive layer 572 may be disposed between the rigid flex printed circuit board and the first metal stiffener 570.

The first capacitive touch sensor 556 and/or the second capacitive touch sensor 524 may be configured to detect a change in capacitance via a change in electric field 592 at the first electromagnetic interference shield 552 of the first system-in-package 550. For example, as a conductive element 590 comes within proximity to the device 500 or makes contact with the device 500, the first capacitive touch sensor 556 may detect the event as a touch input based at least in part on a change in capacitance. The change in capacitance may be detected based on a change in the electric field 592 at the first electromagnetic interference shield 552 of the first system-in-package 550.

In some embodiments, the first capacitive touch sensor 556 and/or the second capacitive touch sensor 524 may be configured to detect a change in capacitance via a change in electric field 582 at a location between the metal shielding 520 and the first electromagnetic interference shield 552 of the first system-in-package 550. For example, as a conductive element 580 comes within proximity to the device 500 or makes contact with the device 500, the first capacitive touch sensor 556 may detect the event as a touch input based at least in part on a change in capacitance. The change in capacitance may be detected based on a change in the electric field 582 between the metal shielding 520 and the first electromagnetic interference shield 552 of the first system-in-package 550.

Figure 6:
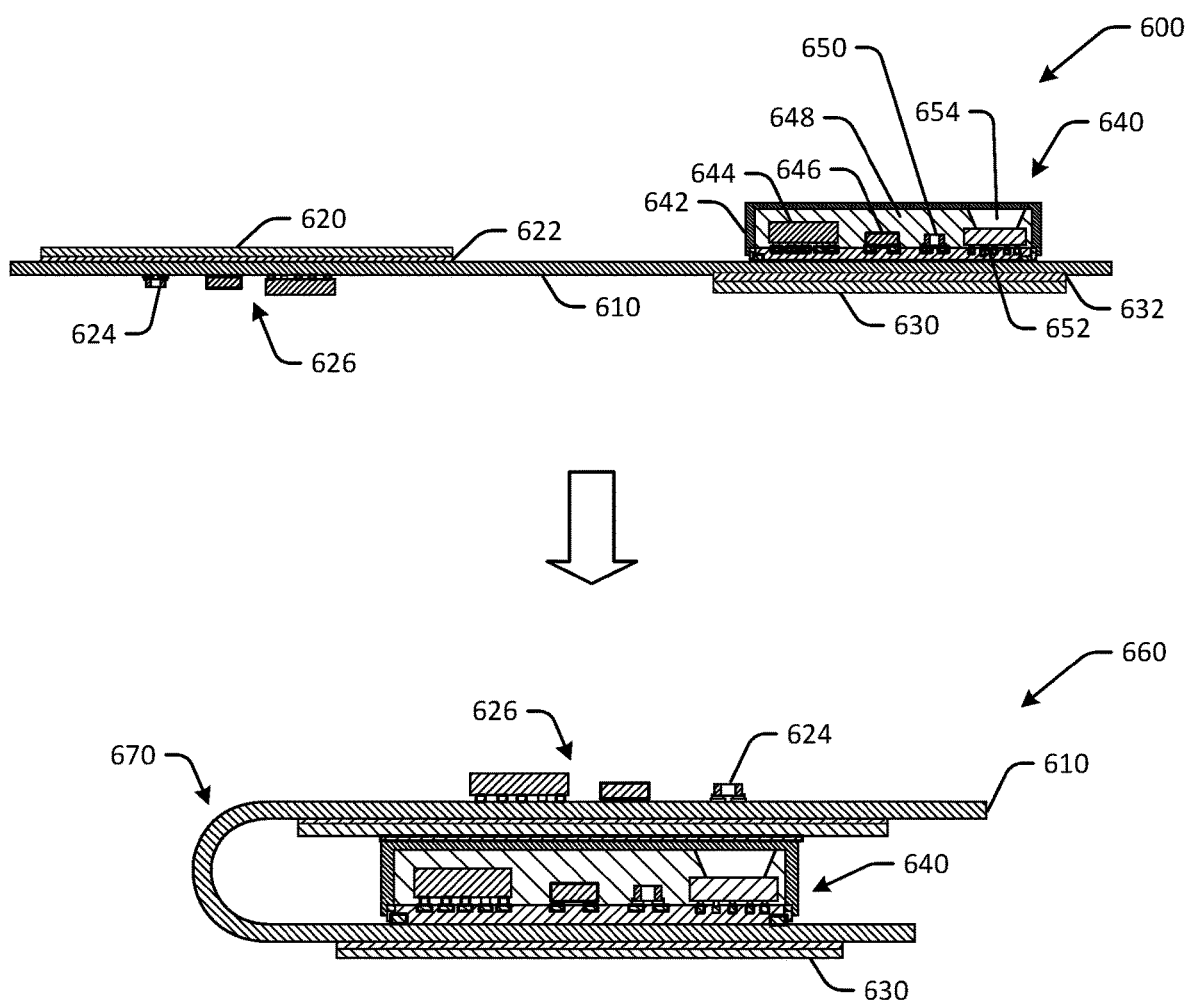
FIG. 6 is a schematic illustration of an example system-in-package with a stiffener used for heat dissipation in accordance with one or more embodiments of the disclosure.
Figure 7:
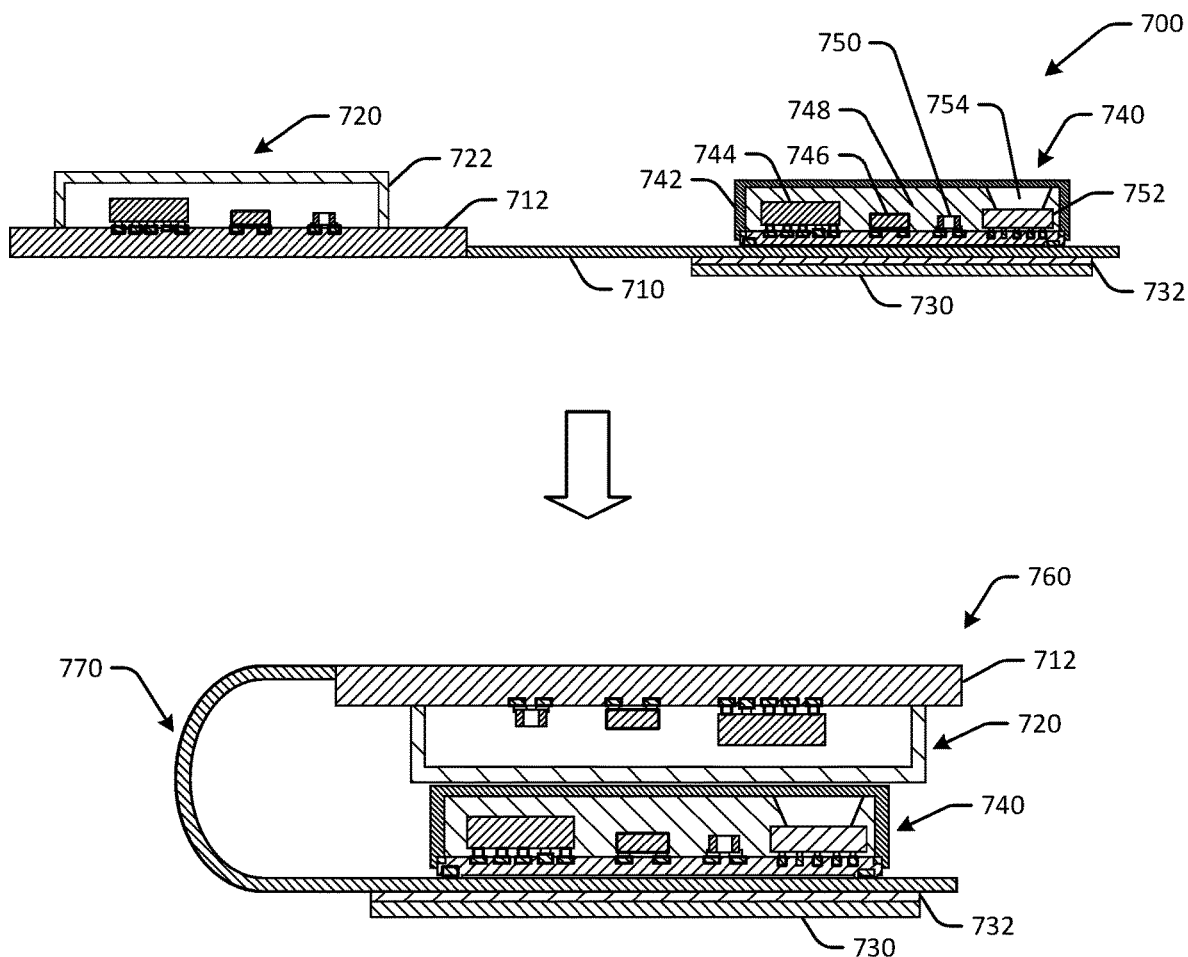
FIG. 7 is a schematic illustration of an example system-in-package with an electromagnetic shield component used for heat dissipation in accordance with one or more embodiments of the disclosure.

Referring to FIGS. 6-7, FIG. 6 is a schematic illustration of an example system-in-package with a stiffener used for heat dissipation in accordance with one or more embodiments of the disclosure. FIG. 7 is a schematic illustration of an example system-in-package with an electromagnetic shield component used for heat dissipation in accordance with one or more embodiments of the disclosure. Other embodiments may include additional or fewer components.

In typical systems-in-packages, sensors or other components that generate heat may not be included, as it may be difficult to dissipate heat due to the sealed or enclosed nature of typical systems-in-packages. For example, some systems-in-packages include one or more different integrated circuits, passive components, and semiconductor chips that are encased in one package. Due to increased component density, effective dissipation of heat from high thermal-generating integrated circuits to the ambient environment may be needed to optimize system performance However, for systems-in-packages, the components are encapsulated in a casing of the systems-in-packages, and may therefore have poor thermal dissipation properties. Adding external heatsinks may be undesirable due to additional space consumption. Instead, some embodiments provide heat dissipation for systems-in-packages using electromagnetic interference components and/or stiffening components, without adding additional components to the device.

In some embodiments, one or more metal stiffeners used to support a portion of a flexible printed circuit may be bonded to the electromagnetic shielding of a system-in-package, so as to improve heat dissipation by transferring heat from the electromagnetic shielding to the metal stiffener(s). The metal stiffeners may be bonded to the electromagnetic shielding using a thermal adhesive, a thermal pad, thermal film, or other material configured to conduct heat. In some embodiments, a thermal conductive material can be used to fill in a cavity formed in the molding compound of a system-in-package, which may transfer heat from the components inside the system-in-package to the electromagnetic shielding that surrounds the system-in-package. For grounding, the electromagnetic shielding may be formed so as to encapsulate the system-in-package about the molding compound, which can also assist in heat dissipation.

In a first embodiment 600 depicted in FIG. 6, a system-in-package 640 may include an electromagnetic interference shielding component 642, an integrated circuit package 644, a capacitive touch sensor 646, one or more passive components 650, one or more flip chip components 652 and/or other components. A molding compound 648 may be disposed on the substrate and may encompass one or more of the other components on the substrate, such as the integrated circuit package 644, the capacitive touch sensor 646, the passive components 650, the flip chip components 652, and so forth. The electromagnetic interference shielding component 642 may be disposed around the molding component 648.

A thermal conductive material 654 may be disposed in a cavity formed in the molding compound 648 adjacent to the flip chip component 652. The thermal conductive material 654 may be any suitable material configured to conduct heat. The electromagnetic interference shielding component 642 may be disposed about an outer surface of the system-in-package 640, and may at least partially cover the thermal conductive material fillings. The thermal conductive material 654 may transfer heat from the respective integrated circuits to the electromagnetic interference shielding component 642 to provide heat dissipation.

The system-in-package 640 may be disposed on a first side of a flexible printed circuit 610. A first metal stiffener 630 may be disposed on a second side of the flexible printed circuit 610 and may be coupled to the flexible printed circuit 610 with a first pressure sensitive adhesive layer 632. One or more additional components 626, such as capacitive touch sensors, passive components, etc. may be disposed on the second side of the flexible printed circuit 610 adjacent to the first metal stiffener 630. A second metal stiffener 620 may be disposed on the side of the flexible printed circuit 610 adjacent to the system-in-package 640 and may be coupled to the flexible printed circuit 610 with a second pressure sensitive adhesive layer 622.

The assembly is depicted in a folded configuration 660. In the folded configuration 660, where the flexible printed circuit 610 forms a U-shaped curve 670, the electromagnetic interference shielding component 642 is bonded to the second metal stiffener 620 to improve heat dissipation. For example, a thermal adhesive, pad, film, or other component may be used to bond the electromagnetic interference shielding component 642 to the second metal stiffener 620. As a result, heat generated by the flip chip 652 can be dissipated via the thermal conductive material 654, the electromagnetic interference shielding component 642, and the second metal stiffener 620.

In a second embodiment 700 of FIG. 7, a rigid flex printed circuit board may be used to improve heat dissipation. A system-in-package 740 may include an electromagnetic interference shielding component 742, an integrated circuit package 744, a capacitive touch sensor 746, one or more passive components 750, one or more flip chip components 752 and/or other components. A molding compound 748 may be disposed on the substrate and may encompass one or more of the other components on the substrate, such as the integrated circuit package 744, the capacitive touch sensor 746, the passive components 750, the flip chip components 752, and so forth. The electromagnetic interference shielding component 742 may be disposed around the molding component 748.

A thermal conductive material 754 may be disposed in a cavity formed in the molding compound 748 adjacent to the flip chip component 752. The thermal conductive material 754 may be any suitable material configured to conduct heat. The electromagnetic interference shielding component 742 may be disposed about an outer surface of the system-in-package 740, and may at least partially cover the thermal conductive material fillings. The thermal conductive material 754 may transfer heat from the respective integrated circuits to the electromagnetic interference shielding component 742 to provide heat dissipation.

The system-in-package 740 may be disposed on a flexible portion 710 of a rigid flex printed circuit board. A first metal stiffener 730 may be disposed on an opposite side of the flexible portion 710 of the rigid flex printed circuit board, and may be coupled to the rigid flex printed circuit board with a first pressure sensitive adhesive layer 732. One or more additional components 720, such as capacitive touch sensors, passive components, etc. may be disposed on a rigid portion 712 of the rigid flex printed circuit board. A metal shielding 722 may be disposed about the one or more additional components 720.

The assembly is depicted in a folded configuration 760, where the rigid flex printed circuit board forms a U-shaped curve 770. In the folded configuration 760, the electromagnetic interference shielding component 742 is bonded to the metal shielding 722 to improve heat dissipation. For example, a thermal adhesive, pad, film, or other component may be used to bond the electromagnetic interference shielding component 742 to the metal shielding 722. As a result, heat generated by the flip chip 752 can be dissipated via the thermal conductive material 754, the electromagnetic interference shielding component 742, and the metal shielding 722.

One or more operations of the methods, process flows, or use cases of FIGS. 1-7 may have been described above as being performed by a user device, or more specifically, by one or more program module(s), applications, or the like executing on a device. It should be appreciated, however, that any of the operations of the methods, process flows, or use cases of FIGS. 1-7 may be performed, at least in part, in a distributed manner by one or more other devices, or more specifically, by one or more program module(s), applications, or the like executing on such devices (where appropriate). In addition, it should be appreciated that processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-7 may be described in the context of the illustrative devices, it should be appreciated that such operations may be implemented in connection with numerous other device configurations.

The operations described and depicted in the illustrative methods, process flows, or use cases of FIGS. 1-7 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-7 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Example Device Architecture

Figure 8:
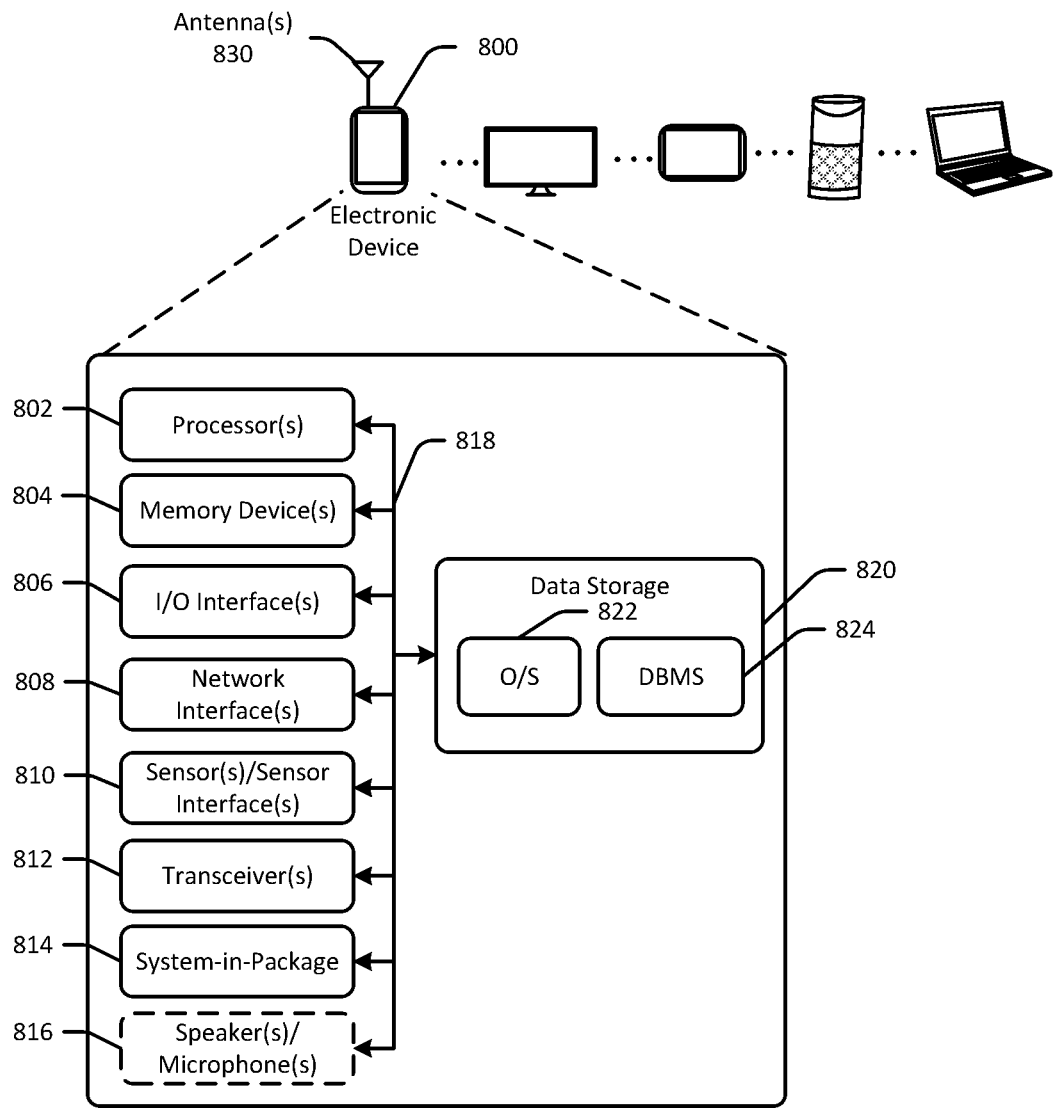
FIG. 8 schematically illustrates an example architecture of an electronic device in accordance with one or more embodiments of the disclosure.

FIG. 8 is a schematic block diagram of one or more illustrative electronic device(s) 800 in accordance with one or more example embodiments of the disclosure. The electronic device(s) 800 may include any suitable computing device including, but not limited to, a server system, a voice interaction device, a mobile device such as a smartphone, a tablet, an e-reader, a wearable device, or the like; a desktop computer; a laptop computer; a content streaming device; or the like. The electronic device(s) 800 may correspond to an illustrative device configuration for the device(s) that includes one or more of the system(s)-in-package(s) of FIGS. 1-7.

The electronic device(s) 800 may be configured to communicate with one or more servers, user devices, or the like. The electronic device(s) 800 may be configured to be coupled to one or more batteries, such as a lithium-ion battery. The electronic device(s) 800 may be configured to use a system(s)-in-package(s) to determine one or more capacitive touch inputs and/or related actions at the device.

The electronic device(s) 800 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 800 may include one or more processors (processor(s)) 802, one or more memory devices 804 (also referred to herein as memory 804), one or more input/output (I/O) interface(s) 806, one or more network interface(s) 808, one or more sensor(s) or sensor interface(s) 810, one or more transceiver(s) 812, one or more system(s)-in-package(s) 814, one or more optional microphone(s) 816, and data storage 820. The electronic device(s) 800 may further include one or more bus(es) 818 that functionally couple various components of the electronic device(s) 800. The electronic device(s) 800 may further include one or more antenna(s) 830 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 818 may include at least one of a system bus, a memory bus, an address bus, or a message bus, and may permit the exchange of information (e.g., data (including computer-executable code), signaling, etc.) between various components of the electronic device(s) 800. The bus(es) 818 may include, without limitation, a memory bus or a memory controller, a peripheral bus, an accelerated graphics port, and so forth. The bus(es) 818 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 804 of the electronic device(s) 800 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 804 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 804 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 820 may include removable storage and/or non-removable storage including, but not limited to, magnetic storage, optical disk storage, and/or tape storage. The data storage 820 may provide non-volatile storage of computer-executable instructions and other data. The memory 804 and the data storage 820, removable and/or non-removable, are examples of computer-readable storage media (CRSM) as that term is used herein.

The data storage 820 may store computer-executable code, instructions, or the like that may be loadable into the memory 804 and executable by the processor(s) 802 to cause the processor(s) 802 to perform or initiate various operations. The data storage 820 may additionally store data that may be copied to the memory 804 for use by the processor(s) 802 during the execution of the computer-executable instructions. Moreover, output data generated as a result of execution of the computer-executable instructions by the processor(s) 802 may be stored initially in the memory 804, and may ultimately be copied to the data storage 820 for non-volatile storage.

More specifically, the data storage 820 may store one or more operating systems (O/S) 822; one or more database management systems (DBMS) 824; and one or more program module(s), applications, engines, computer-executable code, scripts, or the like. Some or all of these module(s) may be sub-module(s). Any of the components depicted as being stored in the data storage 820 may include any combination of software, firmware, and/or hardware. The software and/or firmware may include computer-executable code, instructions, or the like that may be loaded into the memory 804 for execution by one or more of the processor(s) 802. Any of the components depicted as being stored in the data storage 820 may support functionality described in reference to corresponding components named earlier in this disclosure.

The data storage 820 may further store various types of data utilized by the components of the electronic device(s) 800. Any data stored in the data storage 820 may be loaded into the memory 804 for use by the processor(s) 802 in executing computer-executable code. In addition, any data depicted as being stored in the data storage 820 may potentially be stored in one or more datastore(s) and may be accessed via the DBMS 824 and loaded in the memory 804 for use by the processor(s) 802 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like.

The processor(s) 802 may be configured to access the memory 804 and execute the computer-executable instructions loaded therein. For example, the processor(s) 802 may be configured to execute the computer-executable instructions of the various program module(s), applications, engines, or the like of the electronic device(s) 800 to cause or facilitate various operations to be performed in accordance with one or more embodiments of the disclosure. The processor(s) 802 may include any suitable processing unit capable of accepting data as input, processing the input data in accordance with stored computer-executable instructions, and generating output data. The processor(s) 802 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 802 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 802 may be capable of supporting any of a variety of instruction sets.

Referring now to other illustrative components depicted as being stored in the data storage 820, the O/S 822 may be loaded from the data storage 820 into the memory 804 and may provide an interface between other application software executing on the electronic device(s) 800 and the hardware resources of the electronic device(s) 800. More specifically, the O/S 822 may include a set of computer-executable instructions for managing the hardware resources of the electronic device(s) 800 and for providing common services to other application programs (e.g., managing memory allocation among various application programs). In certain example embodiments, the O/S 822 may control execution of the other program module(s). The O/S 822 may include any operating system now known or which may be developed in the future including, but not limited to, any server operating system, any mainframe operating system, or any other proprietary or non-proprietary operating system.

The DBMS 824 may be loaded into the memory 804 and may support functionality for accessing, retrieving, storing, and/or manipulating data stored in the memory 804 and/or data stored in the data storage 820. The DBMS 824 may use any of a variety of database models (e.g., relational model, object model, etc.) and may support any of a variety of query languages. The DBMS 824 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 800 is a mobile device, the DBMS 824 may be any suitable lightweight DBMS optimized for performance on a mobile device.

Referring now to other illustrative components of the electronic device(s) 800, the input/output (I/O) interface(s) 806 may facilitate the receipt of input information by the electronic device(s) 800 from one or more I/O devices as well as the output of information from the electronic device(s) 800 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 800 or may be separate. The I/O devices may further include, for example, any number of peripheral devices such as data storage devices, printing devices, and so forth.

The I/O interface(s) 806 may also include an interface for an external peripheral device connection such as universal serial bus (USB), FireWire, Thunderbolt, Ethernet port or other connection protocol that may connect to one or more networks. The I/O interface(s) 806 may also include a connection to one or more of the antenna(s) 830 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 800 may further include one or more network interface(s) 808 via which the electronic device(s) 800 may communicate with any of a variety of other systems, platforms, networks, devices, and so forth. The network interface(s) 808 may enable communication, for example, with one or more wireless routers, one or more host servers, one or more web servers, and the like via one or more networks.

The antenna(s) 830 may include any suitable type of antenna depending, for example, on the communications protocols used to transmit or receive signals via the antenna(s) 830. Non-limiting examples of suitable antennas may include directional antennas, non-directional antennas, dipole antennas, folded dipole antennas, patch antennas, multiple-input multiple-output (MIMO) antennas, or the like. The antenna(s) 830 may be communicatively coupled to one or more transceivers 812 or radio components to which or from which signals may be transmitted or received.

As previously described, the antenna(s) 830 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(s) 830 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(s) 830 may be configured to transmit or receive radio frequency signals within any suitable frequency range forming part of the unlicensed portion of the radio spectrum.

The antenna(s) 830 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 812 may include any suitable radio component(s) for—in cooperation with the antenna(s) 830—transmitting or receiving radio frequency (RF) signals in the bandwidth and/or channels corresponding to the communications protocols utilized by the electronic device(s) 800 to communicate with other devices. The transceiver(s) 812 may include hardware, software, and/or firmware for modulating, transmitting, or receiving—potentially in cooperation with any of antenna(s) 830—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 812 may further include hardware, firmware, or software for receiving GNSS signals. The transceiver(s) 812 may include any known receiver and baseband suitable for communicating via the communications protocols utilized by the electronic device(s) 800. The transceiver(s) 812 may further include a low noise amplifier (LNA), additional signal amplifiers, an analog-to-digital (A/D) converter, one or more buffers, a digital baseband, or the like.

The sensor(s)/sensor interface(s) 810 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The system(s)-in-package(s) 814 may be any of the system(s)-in-package(s) described herein, and may include sensor(s) configured to determine characteristics of an ambient environment, to capture images, to output audio, and/or other functions. The system(s)-in-package(s) 814 may be coupled to a battery or other components, such as those described in conjunction with FIGS. 1-7. The optional speaker(s)/microphone(s) 816 may be any device configured to receive analog sound input or voice data.

It should be appreciated that the program module(s), applications, computer-executable instructions, code, or the like depicted in FIG. 8 as being stored in the data storage 820 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 800, and/or hosted on other computing device(s) accessible via one or more networks, may be provided to support functionality provided by the program module(s), applications, or computer-executable code depicted in FIG. 8 and/or additional or alternate functionality Further, functionality may be modularized differently such that processing described as being supported collectively by the collection of program module(s) depicted in FIG. 8 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 8 may be implemented, at least partially, in hardware and/or firmware across any number of devices.

It should further be appreciated that the electronic device(s) 800 may include alternate and/or additional hardware, software, or firmware components beyond those described or depicted without departing from the scope of the disclosure. More particularly, it should be appreciated that software, firmware, or hardware components depicted as forming part of the electronic device(s) 800 are merely illustrative and that some components may not be present or additional components may be provided in various embodiments. While various illustrative program module(s) have been depicted and described as software module(s) stored in the data storage 820, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality Moreover, while certain module(s) may be depicted and described as sub-module(s) of another module, in certain embodiments, such module(s) may be provided as independent module(s) or as sub-module(s) of other module(s).

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. A device comprising:
   a flexible printed circuit;
   a first system-in-package disposed on a first side of the flexible printed circuit, wherein the first system-in-package is electrically coupled to the flexible printed circuit, the first system-in-package comprising:
   a first integrated circuit package;
   a first capacitive touch sensor;
   a first molding compound disposed over the first integrated circuit package and the first capacitive touch sensor; and
   a first electromagnetic interference shield disposed around an outer surface of the first molding compound; and
   a first metal stiffener disposed on a second side of the flexible printed circuit, wherein the first metal stiffener is electrically coupled to both the flexible printed circuit and the first capacitive touch sensor;
   wherein the first capacitive touch sensor is configured to detect a change in capacitance via a change in electric field at the first electromagnetic interference shield of the first system-in-package.

2. The device of claim 1, further comprising:
   a second system-in-package disposed on the first side of the flexible printed circuit, wherein the second system-in-package is electrically coupled to the flexible printed circuit, the second system-in-package comprising:
   a second capacitive touch sensor; and
   a second electromagnetic interference shield;
   wherein the flexible printed circuit is in a planar configuration, and wherein the first capacitive touch sensor and second capacitive touch sensor are both configured to detect a change in capacitance via a respective change in electric field between the first electromagnetic interference shield and the second electromagnetic interference shield responsive to:
- (i) presence of a conductive element external to the device at a first point between the first system-in-package and the second system-in-package on the first side of the flexible printed circuit; or
- (ii) presence of the conductive element external to the device at a second point between the first system-in-package and the second system-in-package on the second side of the flexible printed circuit.

3. The device of claim 1, wherein the flexible printed circuit is in a folded configuration, configuration, the device further comprising:
- a passive component disposed on the second side of the flexible printed circuit; and
- a second metal stiffener disposed on the first side of the flexible printed circuit, wherein the second metal stiffener is electrically coupled to the flexible printed circuit, and wherein the first metal stiffener, the first system-in-package, and the second metal stiffener are vertically aligned;
- wherein the first capacitive touch sensor is configured to detect a change in capacitance via a change in electric field at the second metal stiffener.

4. The device of claim 1, wherein the flexible printed circuit is in a folded configuration, configuration, the device further comprising:
- a second system-in-package disposed on the second side of the flexible printed circuit, wherein the second system-in-package is electrically coupled to the flexible printed circuit, the second system-in-package comprising a second capacitive touch sensor, and a second electromagnetic interference shield;
- wherein the first capacitive touch sensor and second capacitive touch sensor are both configured to detect a change in capacitance via a respective change in electric field at the first electromagnetic interference shield responsive to presence of a conductive element external to the device adjacent to the second system-in-package.

5. A device comprising:
- a flexible printed circuit;
- a first system-in-package disposed on a first side of the flexible printed circuit, the first system-in-package comprising:
  - a first electromagnetic interference shield; and
  - a first capacitive touch sensor; and
- a first stiffener formed of a first conductive material and disposed on a second side of the flexible printed circuit, wherein the first stiffener is electrically coupled to both the flexible printed circuit and the first capacitive touch sensor;
- wherein the first capacitive touch sensor is configured to detect a change in capacitance via a change in electric field at the first electromagnetic interference shield.

6. The device of claim 5, further comprising:
- a second system-in-package disposed on the first side of the flexible printed circuit, the second system-in-package comprising:
  - a second electromagnetic interference shield; and
  - a second capacitive touch sensor; and
- a second stiffener formed of a conductive material and disposed on the second side of the flexible printed circuit, wherein the second stiffener is electrically coupled to both the flexible printed circuit and the second capacitive touch sensor;
- wherein the flexible printed circuit is planar, and wherein the first capacitive touch sensor and second capacitive touch sensor are both configured to detect a change in capacitance via a respective change in electric field at the first electromagnetic interference shield or the second electromagnetic interference shield.

7. The device of claim 6, wherein the first capacitive touch sensor and second capacitive touch sensor are both configured to detect a change in capacitance via a change in electric field at the first stiffener or the second stiffener.

8. The device of claim 5, wherein the flexible printed circuit is in a folded configuration, configuration, the device further comprising:
- a passive component disposed on the second side of the flexible printed circuit; and
- a second stiffener disposed on the first side of the flexible printed circuit, wherein the second stiffener is electrically coupled to the flexible printed circuit;
- wherein the first capacitive touch sensor is configured to detect a change in capacitance via a change in electric field at the second metal stiffener.

9. The device of claim 8, wherein the first capacitive touch sensor is configured to detect a change in capacitance via a change in electric field between the first stiffener and the second stiffener.

10. The device of claim 5, wherein the flexible printed circuit is in a folded configuration, configuration, the device further comprising:
- a second system-in-package disposed on the second side of the flexible printed circuit, the second system-in-package comprising:
  - a second electromagnetic interference shield; and
  - a second capacitive touch sensor;
- wherein the first capacitive touch sensor and second capacitive touch sensor are both configured to detect a change in capacitance via a respective change in electric field at the first electromagnetic interference shield or the second electromagnetic interference shield.

11. The device of claim 10, further comprising:
- a housing; and
- a planar member coupled to the housing;
- wherein the flexible printed circuit is folded about the planar member, such that the first system-in-package is disposed on a first side of the planar member, and the second system-in-package is disposed on a second side of the planar member.

12. The device of claim 11, wherein the first capacitive touch sensor is configured to detect a change in capacitance via a change in electric field between the first electromagnetic interference shield and the second electromagnetic interference shield.

13. The device of claim 5, wherein the first capacitive touch sensor is configured to detect a change in capacitance via a change in electric field between the first electromagnetic interference shield and the first stiffener.

14. A device comprising:
- a printed circuit board comprising a flexible portion and a rigid portion;
- a first system-in-package disposed on the flexible portion of the printed circuit board, the first system-in-package comprising a first electromagnetic interference shield;
- a first capacitive touch sensor; and
- a first stiffener formed of a conductive material and disposed on the flexible portion of the printed circuit board, wherein the first stiffener is electrically coupled to the first capacitive touch sensor;

wherein the first capacitive touch sensor is configured to detect a change in capacitance via a change in electric field at the first electromagnetic interference shield.

15. The device of claim 14, further comprising:
a second capacitive touch sensor disposed on the rigid portion of the printed circuit board; and
a shielding disposed around the second capacitive touch sensor.

16. The device of claim 15, wherein the first capacitive touch sensor and second capacitive touch sensor are both configured to detect a change in capacitance via a respective change in electric field at the first electromagnetic interference shield or the shielding.

17. The device of claim 14, wherein the first capacitive touch sensor is configured to detect a change in capacitance via a change in electric field between the first electromagnetic interference shield and the first stiffener.

18. The device of claim 14, further comprising:
a second system-in-package disposed on the rigid portion of the printed circuit board, the second system-in-package comprising a second electromagnetic interference shield.

19. The device of claim 18, wherein the first capacitive touch sensor is configured to detect a change in capacitance via a change in electric field between the first electromagnetic interference shield and the second electromagnetic interference shield.

20. The device of claim 14, wherein the first system-in-package further comprises:
an integrated circuit package; and
a passive component.

* * * * *